United States Patent
Chandler et al.

(10) Patent No.: US 8,835,880 B2
(45) Date of Patent: Sep. 16, 2014

(54) CHARGED PARTICLE-BEAM PROCESSING USING A CLUSTER SOURCE

(75) Inventors: Clive Chandler, Portland, OR (US); Noel Smith, Lake Oswego, OR (US)

(73) Assignee: FEI Company, Hillsboro, OR (US)

( * ) Notice: Subject to any disclaimer, the term of this patent is extended or adjusted under 35 U.S.C. 154(b) by 948 days.

(21) Appl. No.: 11/590,570

(22) Filed: Oct. 31, 2006

(65) Prior Publication Data
US 2008/0142735 A1   Jun. 19, 2008

(51) Int. Cl.
*G21K 5/00* (2006.01)
*H01J 37/305* (2006.01)
*H01J 37/317* (2006.01)

(52) U.S. Cl.
CPC ..... *H01J 37/3056* (2013.01); *H01J 2237/0815* (2013.01); *H01J 2237/3174* (2013.01); *H01J 2237/006* (2013.01); *H01J 2237/31742* (2013.01); *H01J 37/3178* (2013.01); *H01J 2237/31732* (2013.01); *H01J 2237/0812* (2013.01); *H01J 2237/3142* (2013.01); *H01J 2237/31744* (2013.01)
USPC ................... 250/492.21; 250/492.1

(58) Field of Classification Search
None
See application file for complete search history.

(56) References Cited

U.S. PATENT DOCUMENTS

| 4,354,909 | A | * | 10/1982 | Takagi et al. ................. 427/531 |
| 4,687,939 | A | * | 8/1987 | Miyauchi et al. .......... 250/492.2 |
| 4,737,637 | A | | 4/1988 | Knauer |
| 4,740,267 | A | * | 4/1988 | Knauer et al. ................ 438/707 |
| 4,800,100 | A | * | 1/1989 | Herbots et al. ............... 427/527 |
| 4,828,919 | A | * | 5/1989 | Kitakami et al. ............. 428/336 |
| 4,833,319 | A | * | 5/1989 | Knauer ......................... 250/251 |
| 4,856,457 | A | * | 8/1989 | Knauer ......................... 118/666 |
| 4,886,969 | A | * | 12/1989 | Knauer ......................... 250/427 |
| 4,935,623 | A | | 6/1990 | Knauer |
| 4,959,242 | A | * | 9/1990 | Itoh ............................... 427/574 |
| 5,019,712 | A | | 5/1991 | Knauer |
| 5,042,887 | A | * | 8/1991 | Yamada ....................... 359/360 |
| 5,064,520 | A | * | 11/1991 | Miyake et al. .......... 204/192.11 |

(Continued)

FOREIGN PATENT DOCUMENTS

| GB | 2386747 | 9/2003 |
| JP | 02-042957 | 2/1990 |

(Continued)

OTHER PUBLICATIONS

Stevie et al. ("Focused Ion Beam Gases for Deposition and Enhanced Etch," Introduction to Focused Ion Beams 2005, pp. 53-72).*

(Continued)

*Primary Examiner* — Andrew Smyth
(74) *Attorney, Agent, or Firm* — Scheinberg & Associates, PC; Michael O. Scheinberg

(57) ABSTRACT

A cluster source is used to assist charged particle beam processing. For example, a protective layer is applied using a cluster source and a precursor gas. The large mass of the cluster and the low energy per atom or molecule in the cluster restricts damage to within a few nanometers of the surface. Fullerenes or clusters of fullerenes, bismuth, gold or Xe can be used with a precursor gas to deposit material onto a surface, or can be used with an etchant gas to etch the surface. Clusters can also be used to deposit material directly onto the surface to form a protective layer for charged particle beam processing or to provide energy to activate an etchant gas.

28 Claims, 2 Drawing Sheets

(56) References Cited

U.S. PATENT DOCUMENTS

| | | | |
|---|---|---|---|
| 5,083,033 A | 1/1992 | Komano et al. | |
| 5,113,072 A * | 5/1992 | Yamaguchi et al. | 850/16 |
| 5,170,093 A * | 12/1992 | Yamamoto et al. | 313/402 |
| 5,196,102 A * | 3/1993 | Kumar | 427/528 |
| 5,211,994 A * | 5/1993 | Tsukazaki et al. | 427/523 |
| 5,270,552 A | 12/1993 | Ohnishi | |
| 5,286,331 A * | 2/1994 | Chen et al. | 156/345.39 |
| 5,382,315 A * | 1/1995 | Kumar | 216/39 |
| 5,413,820 A * | 5/1995 | Hayashi | 427/527 |
| 5,435,850 A | 7/1995 | Rasmussen | |
| 5,543,111 A * | 8/1996 | Bridges et al. | 422/22 |
| 5,561,326 A * | 10/1996 | Ito et al. | 257/751 |
| 5,582,879 A * | 12/1996 | Fujimura et al. | 427/561 |
| 5,683,547 A | 11/1997 | Azuma et al. | |
| 5,796,111 A * | 8/1998 | Mahoney | 250/492.2 |
| 5,814,194 A | 9/1998 | Deguchi et al. | |
| 5,851,413 A | 12/1998 | Casella et al. | |
| 5,935,454 A * | 8/1999 | Tada et al. | 216/41 |
| 6,042,738 A | 3/2000 | Casey, Jr. et al. | |
| 6,331,227 B1 * | 12/2001 | Dykstra et al. | 156/345.29 |
| 6,498,107 B1 * | 12/2002 | Fenner | 438/706 |
| 6,624,081 B2 * | 9/2003 | Dykstra et al. | 438/710 |
| 6,635,883 B2 | 10/2003 | Torti et al. | |
| 6,743,481 B2 * | 6/2004 | Hoehn et al. | 427/384 |
| 6,753,538 B2 | 6/2004 | Da et al. | |
| 6,838,380 B2 * | 1/2005 | Bassom et al. | 438/680 |
| 6,921,722 B2 * | 7/2005 | Ogure et al. | 438/708 |
| 6,926,935 B2 * | 8/2005 | Arjavac et al. | 427/596 |
| 7,008,862 B2 * | 3/2006 | Snowdon et al. | 438/473 |
| 7,138,100 B2 * | 11/2006 | Smalley et al. | 423/447.3 |
| 7,247,845 B1 * | 7/2007 | Gebhardt et al. | 250/281 |
| 7,344,753 B2 * | 3/2008 | Choi | 427/248.1 |
| 7,423,275 B2 * | 9/2008 | Lee et al. | 250/492.2 |
| 8,088,615 B2 * | 1/2012 | Ausserre | 435/287.2 |
| 8,093,144 B2 * | 1/2012 | Jacobson et al. | 438/509 |
| 2001/0055649 A1 * | 12/2001 | Ogure et al. | 427/248.1 |
| 2002/0005676 A1 * | 1/2002 | Greer | 310/312 |
| 2002/0014407 A1 * | 2/2002 | Allen et al. | 204/298.36 |
| 2002/0016079 A1 * | 2/2002 | Dykstra et al. | 438/710 |
| 2002/0017455 A1 * | 2/2002 | Kirkpatrick et al. | 204/192.34 |
| 2002/0031615 A1 * | 3/2002 | Dykes et al. | 427/551 |
| 2003/0042431 A1 * | 3/2003 | Clevenger et al. | 250/492.21 |
| 2003/0147802 A1 * | 8/2003 | Smalley et al. | 423/447.3 |
| 2004/0033679 A1 * | 2/2004 | Jacobson et al. | 438/510 |
| 2004/0137645 A1 * | 7/2004 | Hu et al. | 438/3 |
| 2004/0171235 A1 * | 9/2004 | Snowdon et al. | 438/473 |
| 2005/0064158 A1 * | 3/2005 | Choi | 428/209 |
| 2005/0183667 A1 * | 8/2005 | Keller et al. | 118/723 I |
| 2006/0045987 A1 * | 3/2006 | Chandler et al. | 427/569 |
| 2006/0102854 A1 * | 5/2006 | Neogi et al. | 250/492.1 |
| 2008/0042057 A1 * | 2/2008 | Sanada et al. | 250/305 |
| 2010/0062422 A1 * | 3/2010 | Ausserre | 435/6 |

FOREIGN PATENT DOCUMENTS

| | | |
|---|---|---|
| JP | 03163825 | 7/1991 |
| JP | 06-184738 | 7/1994 |
| JP | 07-094466 | 4/1995 |
| JP | 2000-146781 | 5/2000 |
| JP | 2000-266651 | 9/2000 |
| JP | 2002-033070 | 1/2002 |
| WO | 88-06194 | 8/1988 |
| WO | WO9738355 | 10/1997 |
| WO | WO0140532 | 6/2001 |
| WO | 2005-059942 | 6/2005 |
| WO | WO 2005/081940 A2 | 9/2005 |

OTHER PUBLICATIONS

Coath, C.D., et al., 'A High-Brightness Duoplasmatron Ion Source for Microprobe Secondary-Ion Mass Spectrometry,' Rev. Sci. Instrum., Feb. 1995, pp. 1018-1023, vol. 66(2).

Jiang, X., et al, 'Mini RF-Driven Ion Sources for Focused Ion Beam Systems,' Review of Scientific Instruments, Apr. 2003, pp. 2288-2292, vol. 74, No. 4.

Johnson, Wayne, 'Electrostatically-Shielded Inductively-Coupled RF Plasma Sources,' High Density Plasma Sources, Ed. Oleg A. Popov, 1995, pp. 100-148.

Smith, N. S., et al., 'High Brightness Inductively Coupled Plasma Source for High Current Focused Ion Beam Applications,' J. Vac. Sci. Technol., Nov./Dec. 2006, pp. 2902-2906, vol. 24(6).

Ono, L.K., et al., 'A Compact Gas Cluster Ion Beam Source of QSEC,' 2003.

Orloff, Jon (editor), "Handbook of Charged Particle Beam Optics," pp. 447-453, 1997, CRC Press.

Fahey, Albert J., et al., C60+ Cluster Source for Secondary Ion Mass Spectrometry, Applied Surface Science, 231-2, Jun. 15, 2004, pp. 186-190.

U.S. Appl. No. 60/830,978, filed Jul. 14, 2006, Smith.

U.S. Appl. No. 60/773,396, filed Feb. 15, 2006, Schmidt.

JP Office Action dated Dec. 5, 2012, 4 pages.

* cited by examiner

CHARGED PARTICLE-BEAM PROCESSING USING A CLUSTER SOURCE

TECHNICAL FIELD OF THE INVENTION

The present invention relates to charged-particle-beam processing.

BACKGROUND OF THE INVENTION

Charged-particle beams, such as ion beams and electron beams, are used for processing work pieces in nanotechnology because charged-particle beams can form very small spots. For example, focused ion beam systems are able to image, mill, deposit, and analyze with sub-micron precision. Focused ion beam systems are commercially available, for example, from FEI Company, Hillsboro, Oreg., the assignee of the present application. The ions can be used to sputter, that is, physically eject, material from a work piece to produce features, such as trenches, in the work piece. An ion beam can also be used to activate an etchant gas to enhance sputtering, or to decompose a precursor gas to deposit material near the beam impact point. An ion beam can also be used to form an image of the work piece, by collecting secondary particles ejected by the impact of the ion beam. The number of secondary particles ejected from each point on the surface is used to determine the brightness of the image at a corresponding point on the image. Focused ion beams are often used in the semiconductor industry. In one application, for example, a focused ion beam is used to cut a small trench into an integrated circuit to expose a cross section of a vertical structure for observation or measurement using an ion beam or an electron beam.

Electron beams can also be used to process a work piece. Electron beam processing is described, for example in U.S. Pat. No. 6,753,538 to Mucil et al. for "Electron Beam Processing." Electron beams are more commonly used for forming images in a process called electron microscopy. Electron microscopy provides significantly higher resolution and greater depth of focus than optical microscopy. In a scanning electron microscope (SEM), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding point on the surface.

In a transmission electron microscope (TEM), a broad electron beam impacts the sample and electrons that are transmitted through the sample are focused to form an image of the sample. The sample must be sufficiently thin to allow many of the electrons in the primary beam to travel though the sample and exit on the opposite site. Samples are typically thinned to a thickness of less than 100 nm. One method of preparing samples includes using a focused ion beam to cut a thin sample from a work piece, and then using the ion beam to thin the sample.

In a scanning transmission electron microscope (STEM), a primary electron beam is focused to a fine spot, and the spot is scanned across the sample surface. Electrons that are transmitted through the work piece are collected by an electron detector on the far side of the sample, and the intensity of each point on the image corresponds to the number of electrons collected as the primary beam impacts a corresponding point on the surface.

When a charged-particle beam impacts a surface, there is the potential for damage or alteration of the surface. Focused ion beam systems typically use gallium ions from liquid metal gallium ion source. Gallium ions are relatively heavy, and a gallium ion accelerated through a typical 30,000 volts will inevitably alter the work piece surface. Plasma ion systems, such as the one described in WO20050081940 of Keller et al. for a "Magnetically Enhanced, Inductively Coupled, Plasma Source for a Focused Ion Beam System," which is hereby incorporated by reference, can use lighter ions, which cause less damage, but the ions will still typically alter the work piece surface. Electrons, while much lighter than ions, can also alter a work surface. When a user desires to measure a work piece with an accuracy of nanometers, changes in the work piece caused by the impact of charged particles can be significant, especially in softer materials, such as photoresist and low-k and ultra-low-k dielectric materials, such as polyphenylene materials.

Currently, technicians quantify the dimensional change that is caused by the charged-particle beam deposition of the protective layer, and then apply a correction factor to subsequent measurements to obtain an estimate of the true dimension. Such estimates are not always accurate because of the variation in the alteration by the charged-particle beam.

When a user desires to use an ion beam to extract a sample viewing with a TEM, as described for example, in U.S. Pat. No. 5,270,552 to Ohnishi, et al. "Method for Separating Specimen and Method for Analyzing the Specimen Separated by the Specimen Separating Method," the user typically scans the focused ion beam in an imaging mode to locate the region of interest. The scanning causes damage to the surface. When the region of interest is located and the beam begins to mill a trench, there is additional damage to the work piece because the edges of the beam are not perfectly sharp. That is, the beam is typically Gaussian shaped, and the ions in the tail of the Gaussian distribution will damage the work piece at the edge of the trench. Damage has been found not just on fragile materials, but also on relatively hard materials.

To protect the work piece surface, it is common to apply a protective layer before charged-particle-beam processing. One method of applying a protective layer is charged-particle-beam deposition, that is, using a charged-particle beam to provide energy to decompose a gas to deposit a material on the surface. The protective layer shields the area around the cut and preserves the characteristics of the features that are to be imaged and measured. Commonly used deposition gasses include precursor compounds that decompose to deposit tungsten, platinum, gold, and carbon. For example, tungsten hexacarbonyl can be used to deposit tungsten, methylcyclopentadienyl trimethyl platinum can be used to deposit platinum, and styrene can be used to deposit carbon. Precursor gases to deposit many different materials are known in the art. The preferred material to be deposited as a protective layer depends on the application, including the composition of the underlying target surface, and the interaction between the protective layer material and the target surface.

Although charged-particle-beam-assisted deposition can locally apply a layer at the precise location where the layer is needed, applying a protective layer using charged-particle beam deposition has several disadvantages. Charged-particle-beam-assisted deposition is relatively slow and, in some processes, up to sixty percent of the total processing time is consumed in deposition of the protective layer. When an ion beam is initially scanned onto the target surface to deposit material, the beam sputters material away from the surface for an initial period of time until a sufficient amount of deposition material accumulates to shield the surface from the ion beam.

Even though that period of time may be small, it can be large enough to allow a significant amount of material to be removed, which causes the accuracy of the cross-sectional analysis to be compromised.

Electron and laser beams can be used to generate secondary electrons to decompose a precursor gas to deposit a protective layer, but those beams may also damage the underlying surface—especially when they are at sufficient energy and/or current density levels for achieving favorable processing time. It is generally not practical to use such beams because deposition will be too slow if the beams are sufficiently "weak" to avoid harm to the underlying surface. Physical vapor deposition ("PVD") sputter methods could be used to deposit protective layers in some applications, but they normally cannot be utilized for production control applications in wafer fabrication facilities because such methods cannot be used to locally apply a deposition layer onto a targeted part of the wafer surface. U.S. Pat. App. No. 60/773,396, which is assigned to the assignees of the present invention, describes a method of PVD that can provide a localized layer. A charged-particle beam is used to sputter material from a target onto the surface. The charged-particle beam is not directed to the surface itself and damage is avoided. This method, however, is time consuming.

Another method of applying a protective coating is described is U.S. Pat. No. 6,926,935 to Arjavec et al. for "Proximity Deposition." In this method, the charged-particle beam is not directed at the area of interest, but to a region outside the area of interest. Secondary electrons decompose the precursor gas over the area of interest to provide a protective layer. As the protective layer is being created around the edge of the region of interest, the charged-particle beam can be moved inward. This method is also time consuming.

Colloidal silver applied with a brush has long been used to produce a conductive protective layer in scanning electron microscopy. The silver particles used are relatively large. Using a brush to apply the layer can damage the substrate and cannot provide a localized layer.

Another method of applying a protective coating is to use a felt tip pen, such as a Sharpie brand pen from the Sanford division of Rubbermaid corporation. The ink from a Sharpie pen is suitable for use in a vacuum chamber, because it dries thoroughly, and there is little outgassing in the vacuum chamber. Touching the pen to the region of interest would alter the surface, so the ink is applied near the region of interest, and the ink then wicks onto the region of interest. Compounds in the ink protect some surfaces. The area affected by the felt tip is very large compared to the sub-micron features of modern integrated circuits, and the positioning accuracy of the ink is insufficient.

Applying a protective layer of fullerene molecules for computer disk drive components is described, for example, in U.S. Pat. No. 6,743,481 to Hoehn et al. for "Process for Production of Ultrathin Protective Overcoats" and U.S. Pat. Pub. No. 20020031615 of Dykes et al. for "Process for Production of Ultrathin Protective Overcoats." Fullerenes are ejected from a source by the impact of an ion beam or an electron beam, and some of the fullerenes are ejected in the direction of the target and coat it.

The industry needs a method of rapidly and accurately applying a localized protective layer without damaging a work piece surface.

SUMMARY OF THE INVENTION

An object of the invention is to deposit onto or etch a work piece surface using a cluster beam to reduce surface damage. This invention includes using a cluster ion source to etch a surface or to deposit material. Using clusters typically reduces substrate damage compared to using individual ions. The invention is particularly useful for depositing a protective layer for charged-particle beam processing. In some embodiments, a precursor gas is decomposed by a cluster beam to deposit a protective layer. In other embodiments, the components of the cluster deposit onto the work piece surface to provide a protective layer for charged particle beam processing. Embodiments of the invention also include systems that allow for deposition of a protective layer using a cluster source and for additional charged particle beam processing.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more through understanding of the present invention, and advantages thereof, reference is now made to the following descriptions taken in conjunction with the accompanying drawings, in which.

DETAILED DESCRIPTION OF PREFERRED EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

In some embodiments of the invention, a cluster beam provides energy to decompose a precursor gas to deposit a layer, while minimizing damage to the work piece surface. The cluster beam can also be used to etch the work piece surface, optionally with an etch-enhancing gas. In other embodiments, a cluster beam directly deposits a protective layer for charged particle beam processing, preferably the protective layer deposition and the charged particle beam processing occurring in the same vacuum chamber.

Figure 1:
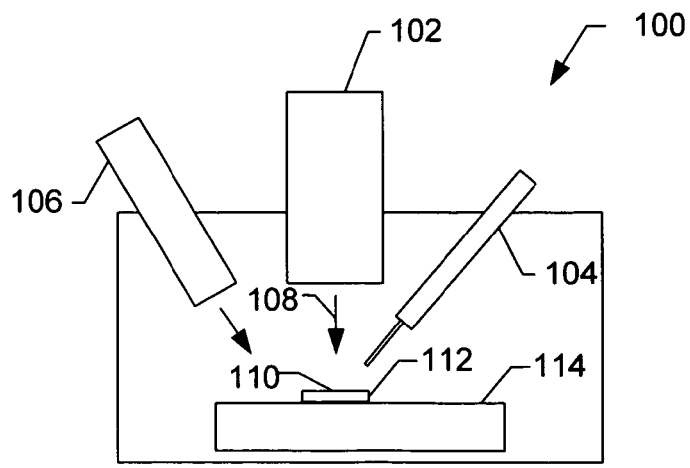
FIG. 1 shows a preferred embodiment of the invention system including a plasma source that is capable of generating charged clusters of atoms and directing the clusters toward a sample.

FIG. 1 shows a simplified illustration of an embodiment of the invention that comprises a charged particle beam system 100 including a cluster ion source 102, a gas injection system 104, and preferably an electron beam column 106. A gas injection system is described, for example, in U.S. Pat. No. 5,851,413 to Casella et al. for "Gas Delivery Systems for Particle Beam Processing," assigned to the assignee of the present invention. Another gas delivery system is described in U.S. Pat. No. 5,435,850 to Rasmussen for a "Gas Injection System," also assigned to the assignee of the present invention. Cluster source 102 provides a beam 108 of clusters of atoms or molecules directed toward a region of interest 110 on a work piece 112, which is positioned within a vacuum chamber 114 on a stage 116 (not shown), preferably capable of moving in at least two directions.

Figure 2:
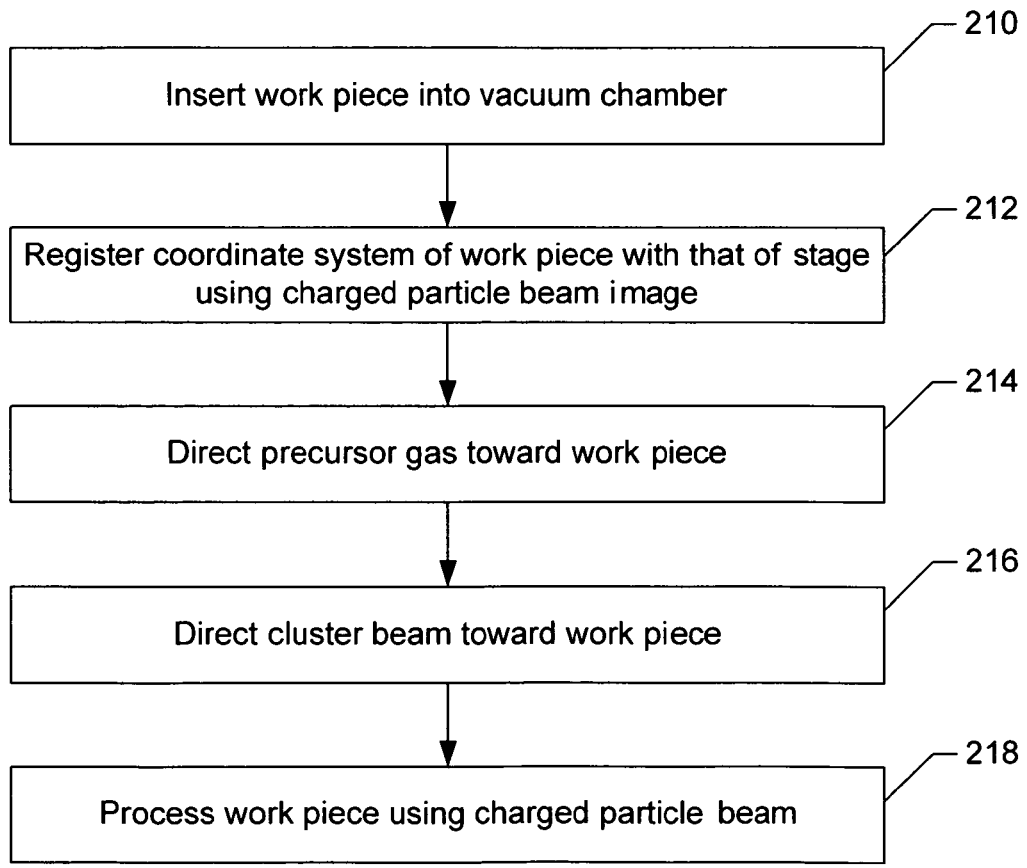
FIG. 2 shows a preferred method in accordance with the invention.

FIG. 2 shows a preferred process in accordance with the invention. In step 210, a work piece is inserted into vacuum chamber 114. In step 212, a portion of the work piece 112 is imaged using the electron beam column 106 to locate markings on the work piece surface to register the coordinate system of the stage 116 with the coordinate system of the work piece 112 so that the stage 116 can be moved to position region of interest 110 within an area toward to which the cluster beam can be directed. In step 214, a jet of a precursor gas is directed toward the work piece 112 in the vicinity of the region of interest 110. Many deposition precursor gases are known, including tetramethylorthosilane (TMOS), tetraethylorthosilane (TEOS), tetrabutoxysilane $Si(OC_4H_9)$, dimethyl acetylacetonate gold, organometallic compounds, such as tungsten hexacarbonyl $(W(CO)_6)$, and methylcyclopentadienyl trimethyl platinum $(C_9H_{16}Pt)$.

In step 216, the beam of clusters is directed to the work piece surface to provide energy to decompose the precursor gas and deposit a protective layer. Clusters of different types of atoms or molecules can be used with the invention. The term "cluster" includes groups of multiple molecules or atoms. For example carbon in the form of fullerenes (e.g., $C_{60}$, $C_{70}$, $C_{80}$, or $C_{84}$), gold $(Au_3)$, bismuth $(Bi_3)$, and xenon $(Xe_{40})$ and other clusters are useful for deposition or etching. The term "cluster" includes not only groups of multiple fullerenes, but also single fullerene molecules which are considered as clusters of carbon atoms. Because each cluster has only one or a few unbalanced electric charges, the charge-to-mass ratio of the clusters can be significantly less than the charge-to-mass ratio of individual atoms or molecules used in charged-particle beams. Although the energy of the entire cluster can be relatively large, for example, several hundred to several thousand electron volts, the energy per component is low.

A typical protective layer is preferably between 0.05 µm and 1 µm thick, more preferably between 0.1 µm and 0.8 µm thick, and most preferably about 0.2 µm thick. A preferred protective layer is sufficiently conductive to dissipate any electrical charge produced by the impact of the charged-particle beam onto the work piece. A preferred protective layer is "vacuum friendly," that is, it does not "outgas" or continue to evaporate in a vacuum chamber to interfere with the charged-particle beam or contaminate the work piece. A preferred protective layer stabilizes the structures on the work piece. The preferred protective layer does not interact with or alter the structures on the work piece and provides mechanical strength so that the dimensions of structures change little or not at all under the impact of the charged-particle beam. The deposition is limited to areas near the impact point of the cluster beam.

Because the clusters have masses that are greater than that of the gallium ions in a typical prior art method, damage to the work piece is confined to surface layer that is thinner than the damage layer caused by a beam of gallium ions. Depending on composition, morphology, and size of clusters used, and the accelerating voltage, damage to the substrate can be confined within the top 20 nm, the top 10 nm, the top 5 nm or the top 2 nm. For example, using a 15 kV accelerating voltage for clusters of $C_{60}$, Au, or Bi clusters would typically limit damage to the top 5 nm of the work piece. By comparison, a typical gallium ion beam damages the surface to a depth of about 30 nm to 50 nm. The preferred accelerating voltage can vary with the type of clusters and the material of the work piece.

In some embodiments, the protective layer can be composed of the material from the clusters, such as a carbon layer deposited from fullerenes, and in such embodiments a deposition precursor gas is unnecessary. That is, the clusters directly deposit onto the work piece. In other embodiments, the protective layer is composed of decomposition products from the precursor gas. In other embodiments, a combination of the material in the cluster beam and decomposition products of a precursor gas are deposited.

In step 218, the region of interest, protected by the protection layer, is processed by a charged particle beam. For example, the region of interest can be viewed using scanning electron microscopy, or the region can be etched, or an additional material can be deposited using an ion beam. If a multi-source system is used as the source of the cluster beam, the plasma material that was the source of the clusters can be removed from the plasma chamber, and the plasma chamber can be filled with a different gas for performing a material removal process or a material deposition process, with or without an etch-enhancing gas or a precursor gas being directed to the region of interest. An example of a multi-source system is described in U.S. Prov. Pat. App. 60/830,978 filed Jul. 14, 2006 for "A Multi-Source Plasma Focused Ion Beam System," which is hereby incorporated by reference and which is assigned to the assignee of the present invention.

In other embodiments, an etch-enhancing gas can be used, and the beam of clusters provides energy to initiate a chemical reaction to etch the work piece with reduced damage outside of the etched area. Etch enghacing gases include XeF2, F2, Cl2, Br2, I2, fluorocarbons, such as trifluoro acetamide and trifluoroacetic acid and trichloroacetic acid, water, ammonia, and oxygen.

A preferred implementation of the invention uses a plasma source as described in U.S. Pat. App. Pub. No. 2005/0183667 for a "Magnetically Enhanced, Inductively Coupled Plasma Source for a Focused Ion Beam System," which is hereby incorporated by reference. Such an ion source provides a beam having very low chromatic aberration and can be focused to a relatively small spot at a relatively high beam current, making it suitable for precise micromachining and deposition. Such a source can provide beams of clusters, as well as beams of individual atoms and molecules for charged particle beam processing. For example, a cluster beam can be used to deposit a protective layer, and then an argon beam can be used with xenon difluoride to micromachine a feature in the work piece.

Figure 3:
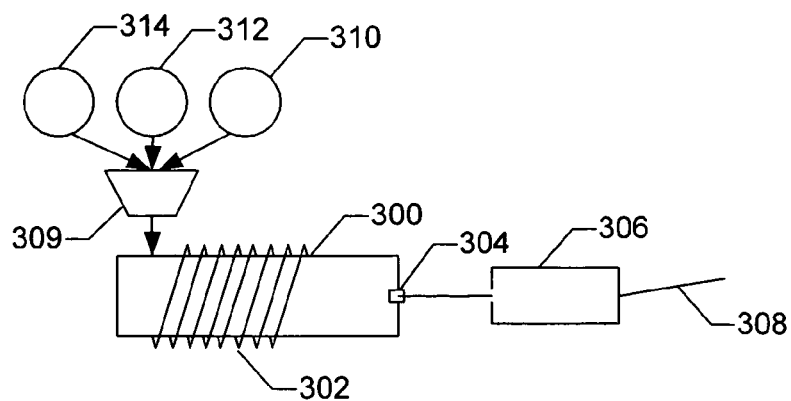
FIG. 3 shows a preferred plasma cluster source.

FIG. 3 shows a simplified schematic diagram of a preferred RF excited, plasma ion chamber. A ceramic plasma ion chamber 300 is wrapped by a coil 302. The coil is excited by an RF source (not shown). Ceramic plasma ion chamber 300 is a cylinder with aperture electrodes 304 at one end. The aperture electrodes exhibit an aperture centered on the cylinder axis of ceramic plasma ion chamber 300. An ion beam leaves ceramic plasma ion chamber 300 through the aperture of the electrodes 304 and passes through an ion beam focusing column 306 to produce a deflectable focused ion beam 308.

Ceramic plasma ion chamber 300 receives, through a valve 309, gas from one or more of a plurality of sources 310, 312, 314. Sources may comprise cluster gases, such as those described above, inert gases such as xenon (Xe) or helium (He), reactive gases such as oxygen ($O_2$), or precursor or etch-enhancing gases as described above. Valve 309 may be provided to select in sequence each of a plurality of different gases from the sources. Thus, one may choose one ion species for milling or etching and choose a second different ion species for deposition.

The source is convenient in that one material can be provided to the plasma source to produce a beam of clusters to provide a protective layer, and then a second material can be provided to the plasma source for further processing of the work piece. For example, one may introduce a gas containing $C_{60}$ to decompose a precursor gas to deposit a protective layer, and then introduce a gas such as Xe for sputtering.

Figure 4:
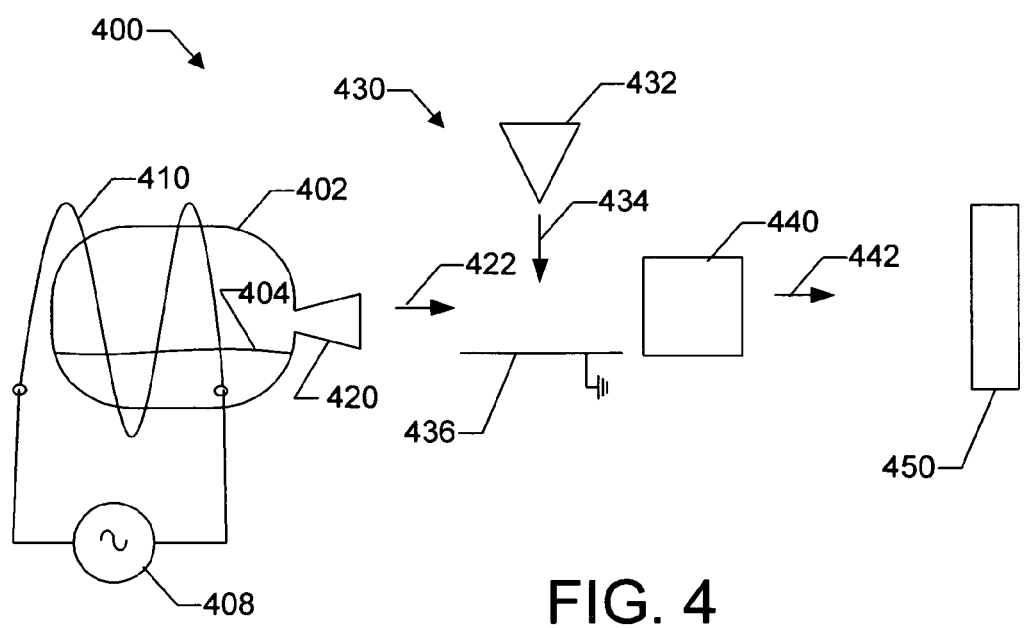
FIG. 4 shows an alternative cluster source.

FIG. 4 shows a schematic of an alternative embodiment of a cluster source 400. The cluster source 400 can be in its own vacuum chamber, or can be in a vacuum chamber that includes one or more additional charged particle beam columns, such as focused ion beam columns, e.g., liquid metal or plasma source columns, or electron beam columns. The non-cluster sources can be used, for example, to process a work piece after a protective layer is applied using the cluster source. The vacuum chamber can include a gas injection system to direct a deposition precursor gas or an etch-enhancing gas toward the work piece.

Cluster source 400 includes a crucible 402 containing a source material 404. A power source 408 heats a heating coil 410 to provide energy to evaporate source material 404. Evaporated atoms or molecules of source material 404, referred to generally as components, expand through a nozzle 420, which causes the atoms or molecules to condense into clusters 422. Clusters are preferably loosely bound groups of atoms or molecules. The components preferably do not form a crystalline structure in the clusters, but are amorphous, resembling a liquid state. Components can also be evaporated by a laser or a beam of electrons or ions.

The clusters 422 are charged in an ionizer 430, which may, for example, include an electron source 432 having an electrical potential to accelerate electrons 434 toward an electrode 436. The electrons 434 collide with clusters 422, ionizing some of the components. Typically only a small number of components, such as one or two, are ionized, so that the electrical charge on each cluster is small. The clusters are optionally passed though a mass filter 440, which may use a combination of electrostatic fields, magnetic fields, and apertures so that a beam of cluster 442 having masses in a desired range exit the mass filter 440 and are directed toward the work piece 450. Skilled persons will recognize that the cluster source described in FIG. 4 is simplified, and that many variations and improvements are known and used.

Such cluster sources have been used, for example, to provide coating for optical components. A typical cluster from the source of FIG. 4 includes between 2 and 10,000 atoms or molecules. The components of a cluster may be loosely bound to each other, although components in some clusters, such as the carbon atoms in fullerenes, are more strongly bound. An efficient cluster source produces a relatively large number of clusters of the desired size, compared to the number of unattached components or clusters of undesirable sizes that are produced. Clusters are charged and typically directed toward the target by electrostatic forces. Because the components can be loosely bound in the cluster, the energy of the cluster can cause it to disintegrate upon impact and allow the components to spread out into a relatively thin, uniform layer on the surface.

Cluster ion sources, including those using $C_{60}$, have been used in secondary mass ion spectroscopy to eject material from the surface of a work piece. The low energy per component insures that little momentum is transferred to individual atoms and molecules in the work piece, resulting in very little mixing of the work piece material.

The term charged-particle-beam "processing" as used herein includes imaging, as well as sputtering, etching and depositing.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of charged-particle beam processing, comprising:
    positioning a work piece in a vacuum chamber;
    directing a gas toward a region of interest, the gas adsorbing to the surface of the work piece without reacting;
    directing a beam of non-reactive clusters toward the region of interest in the vacuum chamber, the beam depositing energy into the region of interest to induce a decomposition of the adsorbed gas at the region of interest, the adsorbed gas decomposing to form a volatile compound and a non-volatile compound that deposits on the surface; and
    directing a charged particle beam in the same vacuum chamber toward a region of the work piece on which the material was deposited to process the work piece.

2. The method of claim 1 in which directing a beam of clusters of atoms or molecules toward a region of interest on the work piece includes directing a beam of clusters including carbon, gold, bismuth, or xenon.

3. The method of claim 1 in which directing a beam of clusters of atoms or molecules toward a region of interest on the work piece includes directing a beam of clusters including $C_{60}$, $C_{70}$, $C_{80}$, $C_{84}$, $Au_3$, $Bi_3$, or $Xe_{40}$.

4. The method of claim 1 in which directing a gas toward the region of interest includes directing a precursor gas comprising a silane compound or an organometallic compound, the precursor gas decomposing in the presence of the beam of clusters to deposit material onto the work piece surface.

5. The method of claim 1 in which directing a gas toward the region of interest includes directing a precursor gas comprising tetramethylorthosilane (TMOS), tetraethylorthosilane (TEOS), tetrabutoxysilane $Si(OC_4H_9)_{:4}$, dimethyl acetylacetonate gold, tungsten hexacarbonyl ($W(CO)_6$) or methylcyclopentadienyl trimethyl platinum ($C_9H_{16}Pt$), the precursor gas decomposing in the presence of the beam of clusters to deposit material onto the work piece surface.

6. The method of claim 1 in which directing a beam of clusters of atoms or molecules toward a region of interest on the work piece includes directing a beam of clusters having an average of greater than 100 components per cluster.

7. The method of claim 1 in which directing a charged particle beam includes directed a focused ion beam or an electron beam.

8. The method of claim 1 in which directing a beam of clusters of atoms or molecules toward a region of interest on the work piece includes directing a beam of clusters from a plasma ion source.

9. The method of claim 8 in which directing a beam of clusters from a plasma ion source includes directing a beam of clusters from an inductively coupled plasma ion source.

10. A method of charged-particle beam processing, comprising:
   positioning a work piece in a vacuum chamber;
   directing a beam of clusters of atoms or molecules toward a region of interest on the work piece to deposit a material onto the work piece surface in the vacuum chamber;
   stopping the beam of clusters of atoms or molecules from striking the work piece; and
   after depositing the material on the work piece surface, directing in the same vacuum chamber a focused ion beam toward the region of interest on which the material was deposited to mill the work piece.

11. The method of claim 10 in which directing a beam of clusters of atoms or molecules toward a region of interest on the work piece includes directing a beam comprising carbon.

12. The method of claim 11 in which directing a beam comprising carbon includes directing a beam of fullerenes.

13. The method of claim 10,
   further comprising before directing the beam of clusters, directing a precursor gas toward the region of interest; and
   and in which the beam of clusters deposits energy into the region of interest to induce a deposition reaction at the region of interest.

14. The method of claim 10 in which directing a beam of clusters of atoms or molecules toward a region of interest on the work piece to deposit a material onto the work piece surface includes depositing a material comprising the material that composes the clusters.

15. The method of claim 10 in which directing a beam of clusters of atoms or molecules toward a region of interest on the work piece includes directing a beam of clusters from an evaporative cluster source.

16. The method of claim 10 in which directing a beam of clusters of atoms or molecules toward a region of interest on the work piece includes directing a beam of clusters including carbon, gold, or bismuth.

17. The method of claim 10 in which directing a beam of clusters of atoms or molecules toward a region of interest on the work piece includes directing a beam of clusters from a plasma ion source.

18. The method of claim 17 in which directing a beam of clusters from a plasma ion source includes directing a beam of clusters from an inductively coupled plasma ion source.

19. A charged-particle beam system, comprising:
   a vacuum chamber;
   a charged particle beam column for directing a beam of focused, non-clustered particles toward a work piece in the vacuum chamber for processing the work piece;
   a work piece support for supporting a work piece within the vacuum chamber;
   a cluster ion source, for directing a primary beam of charged clusters toward the work piece within the vacuum chamber; and
   a gas injection system for providing a gas in the vicinity of the region of interest on the work piece surface, the gas being adsorbed onto the surface and undergoing a chemical reaction only in the presence of the beam of charged clusters.

20. The charged-particle beam system in claim 19 in which the cluster ion source includes a plasma ion source.

21. The charged-particle beam system in claim 20 in which the plasma ion source includes an inductively coupled plasma ion source.

22. The charged-particle beam system in claim 19 in which the cluster ion source includes a source of fullerenes.

23. The charged-particle beam system in claim 19 in which the cluster ion source includes a source of clusters of bismuth, gold, or xenon.

24. The method of claim 1 in which the chemical reaction comprises decomposition of the gas and decomposition of clusters in the beam to induce deposition of material from the gas and the beam onto the region of interest.

25. The charged-particle beam system of claim 19 in which the chemical reaction comprises decomposition of the gas to induce deposition of material from the gas onto the region of interest.

26. The charged-particle beam system of claim 19 in which the chemical reaction comprises decomposition of the gas and decomposition of clusters in the beam to induce deposition of material from the gas and the beam onto the region of interest.

27. The method of claim 19 in which the chemical reaction comprises decomposition of the gas to induce etching of the region of interest.

28. The method of claim 10 in which directing a beam of clusters of atoms or molecules toward a region of interest includes directing a beam of clusters from a plasma chamber.

* * * * *